United States Patent [19]
Gardner

[11] Patent Number: 5,891,803
[45] Date of Patent: Apr. 6, 1999

[54] RAPID REFLOW OF CONDUCTIVE LAYERS BY DIRECTIONAL SPUTTERING FOR INTERCONNECTIONS IN INTEGRATED CIRCUITS

[75] Inventor: Donald S. Gardner, Mountain View, Calif.

[73] Assignee: Intel Corporation, Santa Clara, Calif.

[21] Appl. No.: 670,962

[22] Filed: Jun. 26, 1996

[51] Int. Cl.$^6$ .................................................. H01L 21/283
[52] U.S. Cl. .......................... 438/660; 438/668; 438/672; 204/192.17
[58] Field of Search .................................. 438/660, 661, 438/662, 668, 672; 204/192.17

[56] References Cited

U.S. PATENT DOCUMENTS

| | | | |
|---|---|---|---|
| 4,832,788 | 5/1989 | Nemiroff | 156/643 |
| 4,874,493 | 10/1989 | Pan | 204/192.11 |
| 4,884,123 | 11/1989 | Dixit et al. | 357/71 |
| 4,914,046 | 4/1990 | Tobin et al. | 437/24 |
| 4,920,070 | 4/1990 | Mukai | 438/632 |
| 4,920,071 | 4/1990 | Thomas | 437/188 |
| 4,931,410 | 6/1990 | Tokunaga et al. | 437/189 |
| 5,011,793 | 4/1991 | Obinata | 427/383.1 |
| 5,032,233 | 7/1991 | Yu et al. | 204/192.28 |
| 5,043,300 | 8/1991 | Nulman | 437/200 |
| 5,098,852 | 3/1992 | Niki et al. | 437/11 |
| 5,124,780 | 6/1992 | Sandhu et al. | 357/67 |
| 5,198,154 | 3/1993 | Yokoyama et al. | 252/514 |
| 5,213,638 | 5/1993 | Mahulikar et al. | 148/627 |
| 5,266,521 | 11/1993 | Lee et al. | 437/188 |
| 5,318,923 | 6/1994 | Park | 438/652 |
| 5,360,524 | 11/1994 | Hendel et al. | 204/192.25 |

OTHER PUBLICATIONS

Wolf, S. *Silicon Processing for the VLSI Era—vol. I*, Lattice Press, 1989, pp. 161–164, 335, 75, 104–106, 182–195.

Wolf, S. *Silicon Processing for the VLSI Era—vol. II*, Lattice Press, 1990, pp. 242–244.

Disclosed anonymously *Method for Elimination of Scratches in Polished Damascene Conductors*, Research Disclosure, Feb. 1991, 1 pg.

Wang, S. and Ong, E. *Filling of Contacts and Interconnects with Cu by XeC1 Laser Reflow*, VMIC Conference, 1990 IEEE, Jun. 12–13, 1990, pp. 431–434.

Hu, C., Chang, S., Small, M., and Lewis, J., *Diffusion Barrier Studies for Cu*, VMIC Conference, 1986 IEEE, Jun. 9–10, pp. 181–187.

Edelstein, D., *Advantages of Copper Interconnects*, VMIC Conference, 1995 IEEE, Jun. 27–29, pp. 301–307.

Gardner, D. and Fraser, D., *Low–Temperature Reflow of Copper for Interconnections in Integrated Circuits*, VMIC Conference, 1995 ISMIC, Jun. 27–29, pp. 287–293.

Rossnagel, S. *Filling Dual Damascene Interconnect Structures with AlCu and Cu Using Ionized Magnetron Deposition*, J. Vac. Sci. Technol. B 13(1), Jan./Feb. 1995, pp. 125–129.

Yamashita, M. *Fundamental Characteristics of Built–In High–Frequency Coil–Type Sputtering Apparatus*, J. Vac. Sci. Technol. A 7(2), Mar./Apr. 1989, pp. 151–158.

Posadowski, W. and Radzimski, A. *Sustained Self–Sputtering Using a Direct Current Magnetron Source*, J. Vac. Sci. Technol. A 7(2), Mar./Apr. 1989, pp.

*Primary Examiner*—John F. Niebling
*Assistant Examiner*—Ha Tran Nguyen
*Attorney, Agent, or Firm*—Blakely, Sokoloff, Taylor & Zafman LLP

[57] ABSTRACT

The present invention describes a method for forming interconnections in semiconductor device fabrication. A via (or trench) is formed on a semiconductor substrate. A metal layer is deposited over the semiconductor substrate using directional sputtering techniques. The metal layer is deposited such that the resulting metal layer has a large surface area and a high degree of curvature. The metal layer is then reflowed. During reflow, the high degree of curvature of the metal layer improves the migration of the metal layer. Thus the metal layer is distributed in a manner that rapidly and more evenly fills the via thereby forming a reliable interconnection.

21 Claims, 3 Drawing Sheets

RAPID REFLOW OF CONDUCTIVE LAYERS BY DIRECTIONAL SPUTTERING FOR INTERCONNECTIONS IN INTEGRATED CIRCUITS

BACKGROUND OF THE INVENTION

1. Field of the Invention

The present invention relates to semiconductor processing, and more specifically to a method of reflowing copper to form interconnections in a semiconductor device.

2. Background Information

As the demand for cheaper, faster, lower power microprocessors increases, so must the device packing density of the integrated circuit. Very large scale integration (VLSI) techniques have continuously evolved to meet the increasing demand. All aspects of the integrated circuit must be scaled down to fully minimize the device dimensions of the integrated circuit. In addition to minimizing the device themselves, the dimensions of the electrical interconnections which integrate those devices must also be minimized.

Interconnections increasingly determine the limits in performance, reliability, and power consumption for semiconductor devices. As VLSI dimensions reach into the deep-submicron Ultra Large Scale Integration (ULSI) regime, interconnections for such devices require new materials and new processes for fabrication.

Currently, aluminum (Al) and aluminum alloys are the most commonly used conductive materials for electrical interconnections. Aluminum and its alloys have been fully characterized for use as electrical interconnections and technology has been developed to aid in the formation of aluminum interconnections. While aluminum has very attractive features for use as an electrical interconnection, such as low electrical resistivity and strong adhesion to silicon dioxide ($SiO_2$), as the dimensions of semiconductor devices and their interconnections decrease, the deficiencies of aluminum and its alloys become limiting factors in achieving superior performance. For example, as electrical interconnections become deeper and narrower, it becomes harder to fabricate such interconnections using aluminum without the formation of voids. Void formation is described in detail below with respect to copper, however, it will be obvious to one with ordinary skill in the art that void formation in aluminum interconnections occurs in a similar manner to that of void formation in copper interconnections. Additionally, with decreasing dimensions, design rules become increasingly restricted by aluminum interconnection reliability concerns such as electromigration, stress-induced void formation, hillock suppression, and current density limitations.

For these reasons, the microelectronics industry has recently migrated towards the investigation of more robust, more conductive metals for use in interconnection technology such as Copper (Cu). Copper is approximately 40% lower in resistivity than aluminum and is much more resistant to reliability problems such as electromigration. One of the main reasons why the use of copper and its alloys for interconnection applications has not been more widespread is because a manufacturable dry-etch process has not yet been demonstrated that can pattern copper-based materials using standard photolithographic techniques. FIGS. 1a–1d illustrate a dry-etch process used to try to pattern copper and copper alloy interconnects.

In FIG. 1a, a metal layer 110 has been deposited above silicon dioxide ($SiO_2$) layer 100. For this example, metal layer 110 may be made of copper or a copper alloy. A photoresist layer 120 has been deposited and patterned on top of metal layer 110. Processes for photoresist deposition and patterning are well known in the art and are therefore not described herein.

The structure of FIG. 1a is then subjected to a dry-etch process, for example, reactive-ion etch (RIE), in order to etch away the exposed portions of metal layer 110. The unexposed portions of metal layer 110 which remain after the etch is performed form interconnects 130. As illustrated in FIG. 1c the photoresist is then removed. Finally, oxide 140 is deposited between the interconnections 130, as is illustrated in FIG. 1d.

The problem with dry-etch processes for forming copper interconnects is that all the copper halides have low vapor pressures at room temperature. Etching at low vapor pressures equates to slower etch rates and longer processing times. High vapor pressures allow materials to etch faster, however copper halides, such as chloride and fluoride, only have high enough vapor pressures for etching at temperatures above 200° C. which is too high for most photoresists. To implement the use of copper as a microelectronic interconnection material, it has therefore become necessary to develop alternate patterning techniques.

One technique is known as damascene. In damascene, a dielectric layer is deposited onto a substrate, patterned, and etched back such that the trenches, grooves, vias, or other recessed regions etched into the dielectric layer represent the desired metal interconnection pattern. A conductive material is then deposited over the entire surface of the device, filling in the recessed regions and blanketing the surface of the dielectric layer. Next, the conductive material is etched back to a degree such that the conductive material becomes electrically isolated within the recessed regions etched out of the dielectric layer.

One problem with the damascene process, however is that it is difficult to fill the trench or via with a conductive material without the formation of voids or tunnels which result in interconnections that would have significant reliability problems and degraded electrical performance. Such void formation would ultimately degrade semiconductor device yields thereby adding to the total manufacturing cost. FIGS. 2a–2e illustrate a damascene process.

FIG. 2a illustrates a semiconductor substrate 200 with a dielectric layer 240 deposited on its surface. Dielectric layer 240 is then etched using conventional etch techniques to create trenches 250, as illustrated in FIG. 2b. FIG. 2c illustrates the semiconductor substrate of FIG. 2b during the sputter deposition of a conductive or metal layer 230 on its surface. Note that gap 260 has formed in the metal layer 230.

As the conductive material is deposited onto the substrate in FIG. 2c, the conductive material may be deposited at a faster rate on the top surface and along the walls nearer the top surface than at the bottom of trench 250, thus forming gap 260 and overhangs 270. During deposition, overhangs 270 become larger making it increasingly more difficult to deposit and flow any more conductive material into gap 260. Eventually, as illustrated in FIG. 2d, overhangs 270 will touch and "pinch" the opening of trench 250 shut. Thus, the flow of the conductive material into gap 260 is stopped altogether and void 280 is formed. If the top surface of the substrate is etched back at this point, as illustrated in FIG. 2e, void 280 will remain inside trench 250 leading to the problems described below as well as limiting the current carrying capability of the electrical interconnection.

Voids can cause significant problems in a semiconductor manufacturing process and are considerable issues for sputtered and evaporated films. One problem with voids is that they can trap impurities which can harm the semiconductor device in subsequent process steps. Assuming metal layer 230 of FIG. 2d was etched back using some sort of chemical etching process, the etchant chemicals may become trapped within the void 280 and cause additional etching or corrosion of electrical interconnection 230 even after the etchant has been removed from the surface of the substrate. These trapped etchant chemicals may then contaminate the semiconductor device and could degrade reliability.

Trapped etchant chemicals may also continue to etch the electrical interconnection 230 resulting in the thinning of electrical interconnection 230 and cause the creation of a electrical open, thereby resulting in a failure. Interconnection thinning may also lead to other reliability problems such as electromigration and current-carrying limitations. Another problem is that trapped contaminants may expand if the semiconductor substrate is subjected to subsequent high temperature processing steps. Such expansion could cause significant damage to adjoining surface features of the semiconductor device. Additionally, trapped contaminants may escape during, for example, a subsequent process step thereby contaminating all other semiconductor devices within the process chamber.

It should be noted and it will be obvious to one with ordinary skill in the art, that the potential for forming voids is greatly increased by attempting to fill grooves of significantly varying widths together on a single substrate at the same interconnection level. This is because these deposition processes are typically optimized to fill a groove (or trench) of a particular width and depth. While such optimization techniques may be suitably employed to fill interconnections of one particular width on a semiconductor substrate, the problem is that grooves of other widths for which the process has not been optimized run a much higher risk of void formation. This makes interconnection technology dependent on individual device layout. Such dependence degrades the manufacturability of such processes.

Thus, what is needed is a method for reflowing conductive layers into vias (or trenches) that decreases the formation of voids, decreases fabrication time, and increases the reliability of the electrical interconnections of a semiconductor device.

SUMMARY OF THE INVENTION

The present invention describes a method for forming interconnections in semiconductor device fabrication. A via (or trench) is formed on a semiconductor substrate. A metal layer is deposited over the semiconductor substrate having the via formed therein. The metal layer is deposited such that the resulting metal layer has a high degree of curvature and an increased amount of material initially in the trench. The metal layer is then reflowed. During reflow, the high degree of curvature of the metal layer accelerates the migration of the metal layer. Thus the metal layer is distributed in a manner that more evenly fills the via thereby forming a reliable interconnection.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

Rapid Reflow of Conductive Layers by Directional Sputtering for Interconnections in Integrated Circuits is disclosed. In the following description, numerous specific details are set forth such as specific materials, process parameters, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

The present invention describes a method for improving the reflow of metals in the fabrication of electrical interconnections for semiconductor devices. The present invention is utilized for the reflow of metal (conductive layers) into vias (or trenches) to form interconnections, in particular the filling of vias with submicron dimensions.

It is to be noted that the term "substrate" is used throughout the present disclosure. Substrate is used to refer to a semiconductor substrate or a part thereof. The term substrate includes but is not limited to: fully processed, semi-processed, or unprocessed substrates with semiconductor materials thereon. It should also be noted that general processing steps used in the fabrication of electrical interconnections for semiconductor devices are well known in the art and will be obvious to one with ordinary skill in the art, therefore, these steps are not described in detail.

Figure 3A:
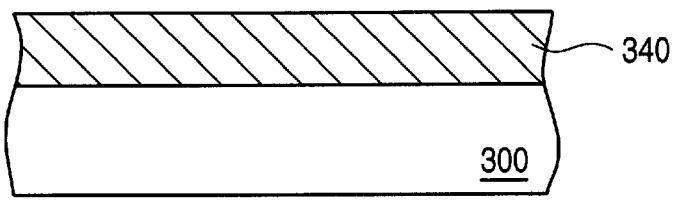
FIG. 3a illustrates a cross sectional view of a dielectric layer deposited above a semiconductor substrate.

FIG. 3a illustrates a semiconductor substrate 300 with a dielectric layer 340 deposited thereon. Dielectric layer 340 is typically made of SiO2 (oxide), but may be silicon nitride (nitride), silicon oxynitride, BSG, PSG, BPSG, silicon carbide, other organic dielectrics such as polyimide, or any other dielectric material which is compatible with semiconductor manufacturing technology. It should be noted and it will be obvious to one with ordinary skill in that art, that dielectric layer 340 may be a multilayer dielectric made of multiple levels of dielectric materials whether the same dielectric material or different dielectric materials.

Figure 3B:
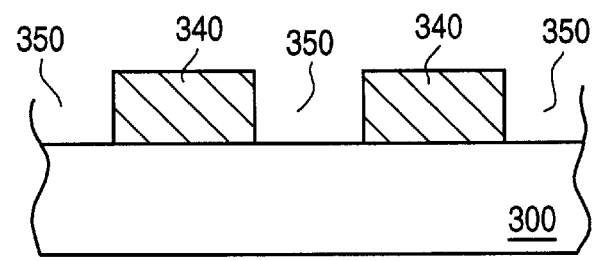
FIG. 3b illustrates a cross sectional view of the structure in FIG. 3a after the dielectric layer has been patterned and etched.

FIG. 3b illustrates the structure of FIG. 3a after dielectric layer 340 has been etched or patterned to form grooves (or vias) 350 therein. It should be noted that dielectric layer 340 may be patterned using well known photolithographic masking and etching techniques, for example, RIE, sputter etch, ion milling, wet chemical etch, etc. Grooves 350 may be formed with submicron dimensions and high aspect ratios. It will be obvious to one with ordinary skill in the art that although multiple grooves are shown in FIGS. 3a–3e the present invention may also be used where only a single groove is formed. It should also be noted and it will be obvious to one with ordinary skill in the art, that although grooves 350 are shown as having the same dimensions (i.e. width and depth) grooves 350 may be formed having varying widths and/or varying depths.

Figure 1A:
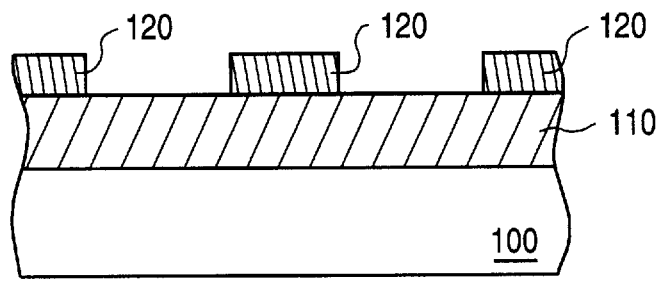
FIG. 1a illustrates a cross sectional view of a patterned mask above a metal layer on a semiconductor substrate.
Figure 1B:
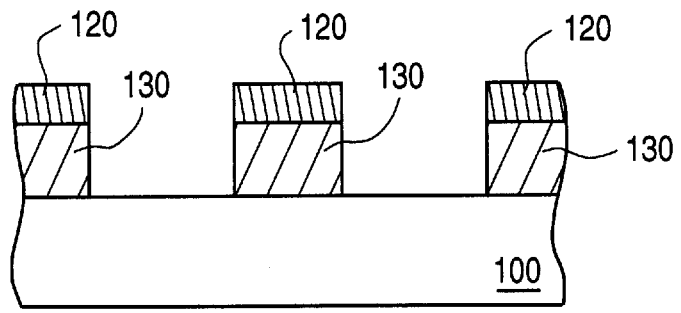
FIG. 1b illustrates a cross sectional view of the structure in FIG. 1a after a dry-etch process has been performed.
Figure 1C:
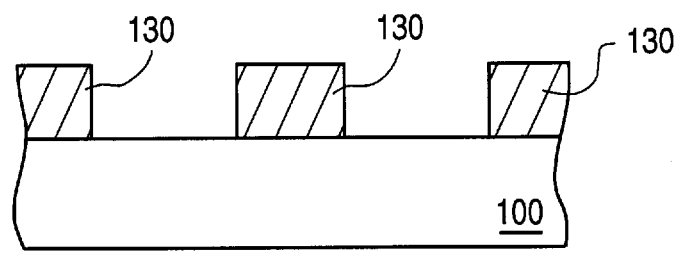
FIG. 1c illustrates a cross sectional view of the structure in FIG. 1b after the mask has been removed.
Figure 1D:
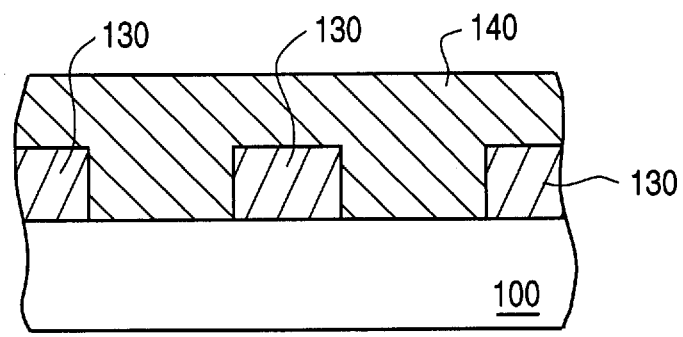
FIG. 1d illustrates a cross sectional view of the structure in FIG. 1c after the trenches have been filled with a dielectric.
Figure 2A:
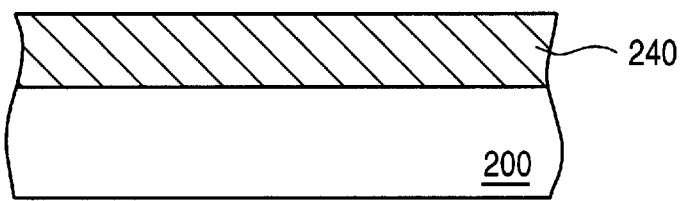
FIG. 2a illustrates a cross sectional view of a dielectric layer deposited above a semiconductor substrate.
Figure 2B:
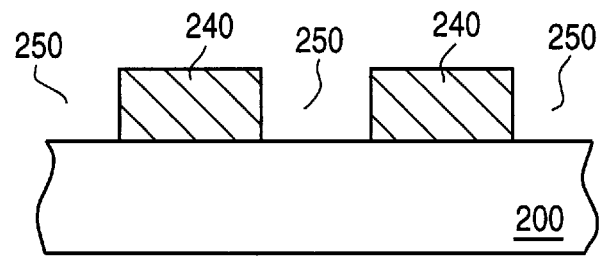
FIG. 2b illustrates a cross sectional view of the structure in FIG. 2a after the dielectric layer has been patterned and etched.
Figure 2C:
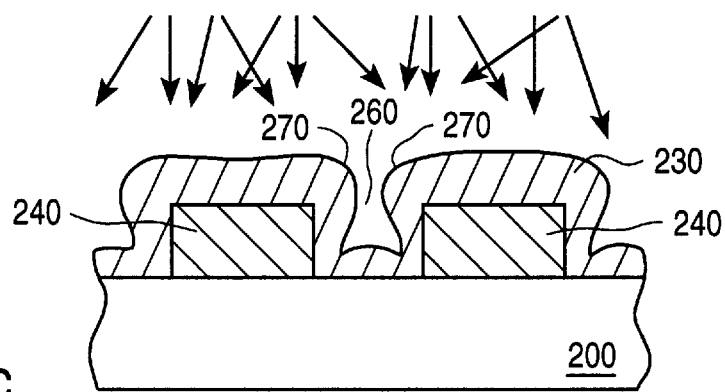
FIG. 2c illustrates a cross sectional view of the structure of FIG. 2b during sputter deposition of a metal layer above the patterned dielectric layer.
Figure 2D:
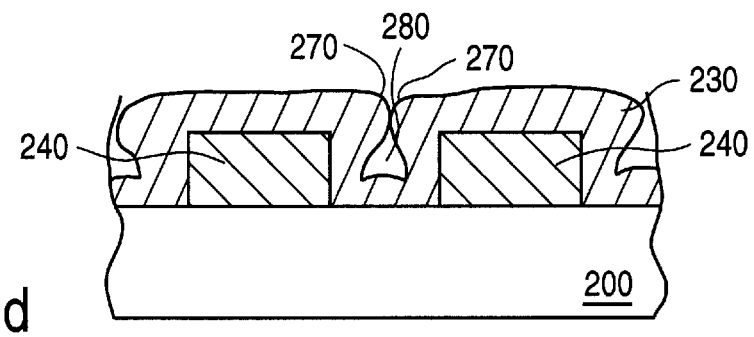
FIG. 2d illustrates a cross sectional view of the structure of FIG. 2c during reflow of the metal layer.
Figure 2E:
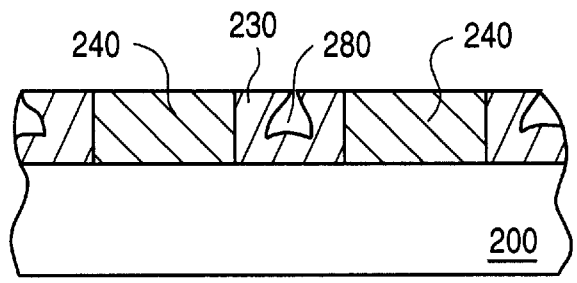
FIG. 2e illustrates a cross sectional view of the structure of FIG. 2d after reflow is completed and the excess metal layer has been removed.
Figure 3C:
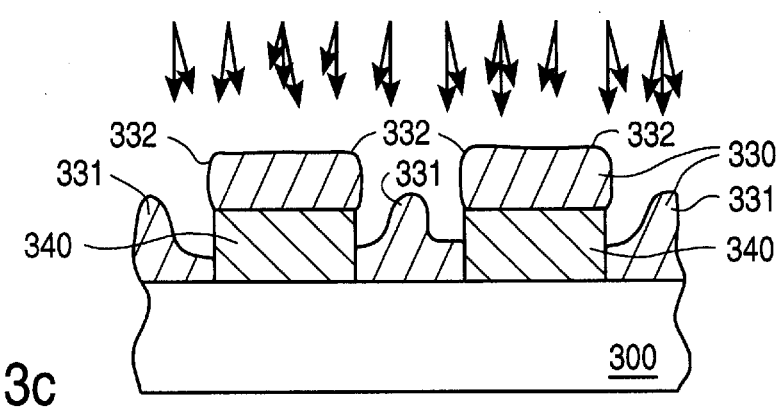
FIG. 3c illustrates a cross sectional view of the structure of FIG. 3b during deposition of a metal layer above the patterned dielectric layer in accordance with one embodiment of the present invention.

After grooves 350 are formed a conductive layer 330 is deposited. Conductive layer 330 may be made of copper, copper alloys, aluminum, aluminum alloys, or other metals and metal alloys that exhibit good electrical properties for use in semiconductor devices. In one embodiment of the present invention conductive layer 330 is deposited using directional sputtering, as illustrated in FIG. 3c. Directional sputtering increases the control over the deposition of the conductive layer. As illustrated in FIG. 2c, conventional sputtering techniques deposit the conductive layer with a broad range of angles and a peak in the angular distribution that is at a high angle. Because of the large and varying angles of conventional sputtering techniques, the conductive material is deposited at faster rates on the top surfaces and along the walls nearer the top of the grooves, thus forming overhangs and gaps, as is described above in the discussion of FIGS. 2a–2e.

Directional sputtering on the other hand enables the deposition of conductive layer 330 to be more controlled. Directional sputtering can be achieved by using several techniques, for example, longer target-to-substrate spacing, collimation, ionized sputtering using either electron cyclotron resonance (ECR) cathodes or inductively coupled plasmas, or sustained self-sputtering.

As illustrated in FIG. 3c, with directional sputtering the flux of the atoms tends to be more perpendicular to the surface with fewer high angle components than conventional sputtering techniques. Directional sputtering deposits the conductive material such that gaps are formed at the steps in the topography of the substrate surface, rather than forming gaps in the center of the groove and overhangs on the steps of the topography as are formed with conventional sputtering. Thus, as illustrated in FIG. 3c, conductive layer 330 "piles up" on all the exposed surfaces including the bottom surface of grooves 350 with gaps being formed near the walls of grooves 350. Because the conductive material "piles up", the conductive layer is deposited with a large exposed surface area and high degree of curvature, as is illustrated in FIG. 3c by the piles of conductive material 331 within grooves 350 and by the top edges of conductive material 332 above the outer walls of grooves 350.

The larger the surface area of conductive layer 330, the greater the number of broken bonds within the conductive material. The broken bonds of conductive layer 330 are waiting to react and form complete bonds with other atoms. The greater the number of broken bonds, the higher the surface energy and the easier the layer is to reflow. The higher the degree of curvature of the conductive layer 330, the shorter the distance in the horizontal direction the atoms have to move in order to complete their bonds and the more rapid the reflow process. Thus, the higher the degree of curvature the more reasonable the reflow time.

Figure 3D:
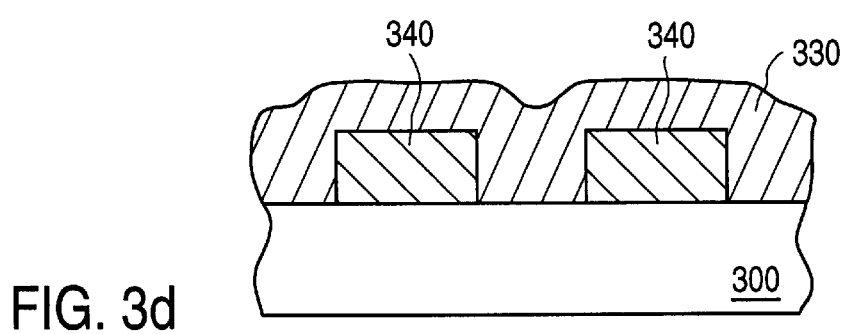
FIG. 3d illustrates a cross sectional view of the structure of FIG. 3c during reflow of the metal layer that was deposited in accordance with one embodiment of the present invention.

FIG. 3d illustrates the structure of FIG. 3c during reflow. During reflow the atoms of the conductive layer especially those with broken bonds migrate to the bottom of the via, filling in the gaps along the sidewalls of grooves 350. Because the number of broken bonds is increased with the present invention the atoms migrate to the bottom of the via, filling in the gaps, in order to form complete bonds with other atoms. Also, because of the high degree of curvature with the present invention the atoms do not have to travel long distances to complete their bonds. Thus, the present invention improves the fabrication of interconnects by decreasing the formation of voids and decreasing the time it takes to fill a via.

The time it takes to fill a via (i.e. grooves 350) is also dependent upon the temperature used during reflow and the particular conductive layer used. For example, in one embodiment of the present invention wherein the conductive material is copper and/or copper alloys, reflow is performed at temperatures in the range of approximately 200°–500° C., and preferably at a temperature of approximately 350° C. In another embodiment of the present invention wherein the conductive material is aluminum and/or aluminum alloys, reflow is performed at temperatures in the range of approximately 150°–500° C., and preferably at a temperature of approximately 350° C.

In one embodiment of the present invention the deposition and/or reflow of the conductive layer is performed in a high vacuum. In another embodiment of the present invention the deposition and/or reflow is performed in a hydrogen plasma. Performing the deposition and/or reflow of the conductive layer in a high vacuum or hydrogen plasma helps to decrease the contamination level on the surface while reflowing the electrical interconnects, thereby allowing the atoms to move more freely and rapidly on the surface.

Figure 3E:
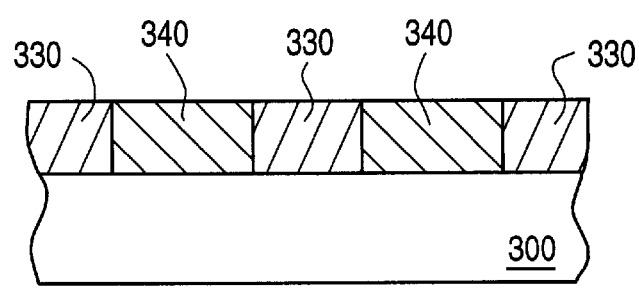
FIG. 3e illustrates a cross sectional view of the structure of FIG. 3d after reflow is completed and the excess metal layer has been removed.

FIG. 3e illustrates the structure of FIG. 3d after the completion of an etch back process step. In one embodiment of the present invention, well known chemical-mechanical polishing processes can be used to etch the conductive layer 330 from the upper surfaces of dielectric layer 340. Thus, the portion of the conductive layer 330 which exists substantially outside the grooves 350 is removed thereby isolating conductive layer 330 to the grooves 350. In another embodiment of the present invention, an upper portion of dielectric layer 340 is also removed as part of an over-etch process to be sure most of the conductive layer 330 which resides substantially outside the grooves 350 has been removed. In an alternate embodiment of the present invention, an alternate etch process such as wet chemical etch, reactive ion etch (RIE), back sputter, ion mill, or mechanical polishing can be used to remove the portion of the conductive layer 330 which resides substantially outside the grooves 350. Note that etching techniques such as polishing additionally serve to planarize the surface of the substrate.

It should be noted that wetting layers may also be useful in conjunction with the present invention in order to reduce agglomeration and improve migration of the atoms. If it is desirable to use a wetting layer, for example titanium (Ti) or tantalum (Ta), the wetting layer may be deposited after formation of the groove 350, as illustrated in FIG. 3b, and before the deposition of the conductive layer 330, as illustrated in FIG. 3c.

It should also be noted that the steps of depositing the conductive layer and reflowing may be performed one at a time or simultaneously depending upon the particular preferences of the manufacturer.

Thus, Rapid Reflow of Conductive Layers by Directional Sputtering for Interconnections in Integrated Circuits has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A method for filling interconnections comprising:

forming a via in a dielectric layer;

depositing a metal layer, wherein said metal layer is deposited such that said metal layer forms a pile in the center of said via and on the top of the topography of said dielectric layer said metal layer having a high degree of curvature, and;

reflowing said metal layer.

2. The method as described in claim 1 wherein said via is formed in an oxide.

3. The method as described in claim 1 wherein said metal is patterned using damascene etching.

4. The method as described in claim 1 wherein said metal layer is deposited using directional sputtering.

5. The method as described in claim 1 wherein said step of reflowing said metal layer is performed in a vacuum.

6. The method as described in claim 1 wherein said step of reflowing said metal layer is performed in a hydrogen plasma ambient.

7. The method as described in claim 1 wherein said metal is selected from the group consisting of: copper and copper alloys.

8. The method as described in claim 7 wherein said step of reflowing said metal layer is performed at a temperature in the range of 200°–500° C.

9. The method as described in claim 1 wherein said metal is selected from the group consisting of: aluminum and aluminum alloys.

10. The method as described in claim 9 wherein said step of reflowing said metal layer is performed at a temperature in the range of 150°–500° C.

11. The method as described in claim 1 wherein said step of reflowing said metal layer is performed during said step of depositing said metal layer.

12. A method for filling interconnections comprising:

forming a via in a dielectric layer;

depositing a metal layer, wherein said metal layer is deposited using directional sputtering such that said deposited metal layer forms a pile in the center of said via and on the top of the topography of said dielectric layer, said metal layer having a high degree of curvature, and;

reflowing said metal layer.

13. The method as described in claim 12 wherein said via is formed in an oxide.

14. The method as described in claim 12 wherein said metal is patterned using damascene etching.

15. The method as described in claim 12 wherein said step of reflowing said metal layer is performed in a vacuum.

16. The method as described in claim 12 wherein said step of reflowing said metal layer is performed in a hydrogen plasma ambient.

17. The method as described in claim 12 wherein said metal is selected from the group consisting of: copper and copper alloys.

18. The method as described in claim 17 wherein said step of reflowing said metal layer is performed at a temperature in the range of 200°–500° C.

19. The method as described in claim 12 wherein said metal is selected from the group consisting of: aluminum and aluminum alloys.

20. The method as described in claim 19 wherein said step of reflowing said metal layer is performed at a temperature in the range of 150°–500° C.

21. The method as described in claim 12 wherein said step of reflowing said metal layer is performed during said step of depositing said metal layer.

\* \* \* \* \*